United States Patent
Kasai

(10) Patent No.: US 10,439,097 B2
(45) Date of Patent: Oct. 8, 2019

(54) METHOD FOR MANUFACTURING LIGHT EMITTING DEVICE

(71) Applicant: NICHIA CORPORATION, Anan-shi, Tokushima (JP)

(72) Inventor: Daisuke Kasai, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 16/127,657

(22) Filed: Sep. 11, 2018

(65) Prior Publication Data

US 2019/0081202 A1    Mar. 14, 2019

(30) Foreign Application Priority Data

Sep. 14, 2017  (JP) ................. 2017-176334

(51) Int. Cl.
| | |
|---|---|
| H01L 33/00 | (2010.01) |
| H01L 25/075 | (2006.01) |
| H01L 33/40 | (2010.01) |
| H01L 33/50 | (2010.01) |

(52) U.S. Cl.
CPC ......... *H01L 33/005* (2013.01); *H01L 25/075* (2013.01); *H01L 25/0753* (2013.01); *H01L 33/00* (2013.01); *H01L 33/0095* (2013.01); *H01L 33/40* (2013.01); *H01L 33/405* (2013.01); *H01L 33/50* (2013.01); *H01L 33/502* (2013.01); *H01L 33/505* (2013.01); *H01L 2933/0016* (2013.01); *H01L 2933/0041* (2013.01)

(58) Field of Classification Search
CPC ...................................................... H01L 33/00
See application file for complete search history.

(56) References Cited

FOREIGN PATENT DOCUMENTS

| | | |
|---|---|---|
| JP | 2008-060166 A | 3/2008 |
| JP | 2013-089644 A | 5/2013 |
| JP | 2013-118210 A | 6/2013 |
| JP | 2017-069368 A | 4/2017 |
| WO | 2013005646 A1 | 1/2013 |

*Primary Examiner* — Marvin Payen
(74) *Attorney, Agent, or Firm* — Global IP Counselors, LLP

(57) ABSTRACT

A method for manufacturing a light emitting device includes: preparing an LED die having a laminated structure including a light emitting surface, an electrode forming surface, and a side surface, and at least one electrode placed on the electrode forming surface; preparing a wavelength conversion member having an upper surface defining a recess, the recess having an opening diameter greater than a diameter of the light emitting surface in a plan view; placing a light-transmissive member within the recess; mounting the LED die on an upper surface of the light-transmissive member white the light emitting surface faces the upper surface of the light-transmissive member and pressing the LED die so that at least a portion of the light-transmissive member is placed on the side surface of the laminated structure; and placing a light reflecting member to cover the LED die, the light-transmissive member, and the wavelength conversion member.

10 Claims, 3 Drawing Sheets

METHOD FOR MANUFACTURING LIGHT EMITTING DEVICE

CROSS-REFERENCE TO RELATED APPLICATIONS

This application claims priority to Japanese Patent Application No. 2017-176334 filed on Sep. 14, 2017. The entire disclosure of Japanese Patent Application No. 2017-176334 is hereby incorporated herein by reference.

TECHNICAL FIELD

The present invention relates to a method for manufacturing a light emitting device.

BACKGROUND ART

For example, in International Publication No. 2013/005646, described is a method for manufacturing a semiconductor light emitting element in which an adhesive agent is coated on a portion of a phosphor sheet on which an LED die is mounted, and includes a step of, after the LED die is mounted on the phosphor sheet, pressing the LED die into the phosphor sheet so that the light emitting color is a designated value.

SUMMARY

In the aforementioned prior art method for manufacturing a semiconductor light emitting element, when the LED is pressed, there may be significant wet spreading of the adhesive agent on the phosphor sheet, and stable formation of a fillet on the side part of the LED die is difficult.

In light of that, the purpose of an embodiment of the present invention is to provide a method for manufacturing a light emitting device for which it is easy to control the shape of a light-transmissive member that connects an LED die and a wavelength conversion member.

A method for manufacturing a light emitting device according to an embodiment includes: preparing an LED die having a laminated structure including a light emitting surface, an electrode forming surface on a reverse side of the light emitting surface, and a side surface between the light emitting surface and the electrode forming surface, and an electrode placed on the electrode forming surface; preparing, a wavelength conversion member having an upper surface with a recess, the recess having an opening diameter greater than a diameter of the light emitting surf ice placing a light-transmissive member within the recess; placing at least a portion of the light-transmissive member on the side surface of the laminated structure by mounting the LED die on an upper surface of the light-transmissive member while the light emitting surface faces the upper surface of the light-transmissive member, and pressing the LED die; and placing a light reflecting member to cover the LED die, the light-transmissive member, and the wavelength conversion member.

The method for manufacturing the light emitting device of the embodiment noted above makes it easy to control the shape of the light-transmissive member that connects the LED die and the wavelength conversion member.

DETAILED DESCRIPTION OF EMBODIMENTS

Figure 1A:
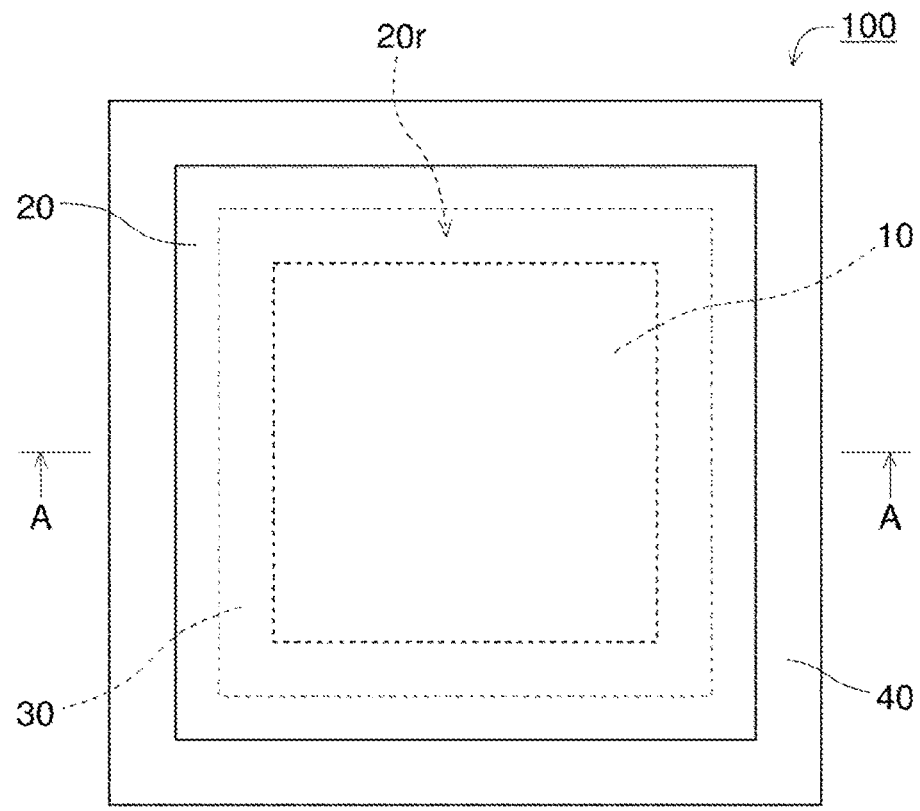
FIG. 1A is a schematic top view of a light emitting, device of an embodiment of the present invention.

Following, an embodiment of the invention is explained while referring to drawings as appropriate. However, the light entitling device and manufacturing method thereof explained hereafter are for showing concrete, examples of the technical concept of the present invention, and unless specifically noted, the present invention is not limited to the items below. Also, the size and positional relationship, etc., of the members shown in the drawings are for clarifying the explanation, and may be exaggerated.

With the embodiment of the present invention, the visible wavelength range is the range of wavelength 380 nm to 780 nm, the blue range is the range of wavelength 420 nm to 480 nm, the green range is the range of wavelength 500 nm to 560 nm, the yellow range is the wavelength range of longer than 560 nm and 590 nm or less, and the red range is the range of wavelength 610 nm to 750 nm.

Also, "light-transmissive" in this specification means that the light transmittance at the light emission peak wavelength of the LED die is 60% or greater, more preferably 70% or greater, and even more preferably 80% or greater. "Light reflective" in this specification means that the light reflectivity rate at the light emission peak wavelength of the LED die is 60% or greater, mote preferably 70% or greater, and even more preferably 80% or greater.

Embodiment 1

Light Emitting Device 100

Figure 1B:
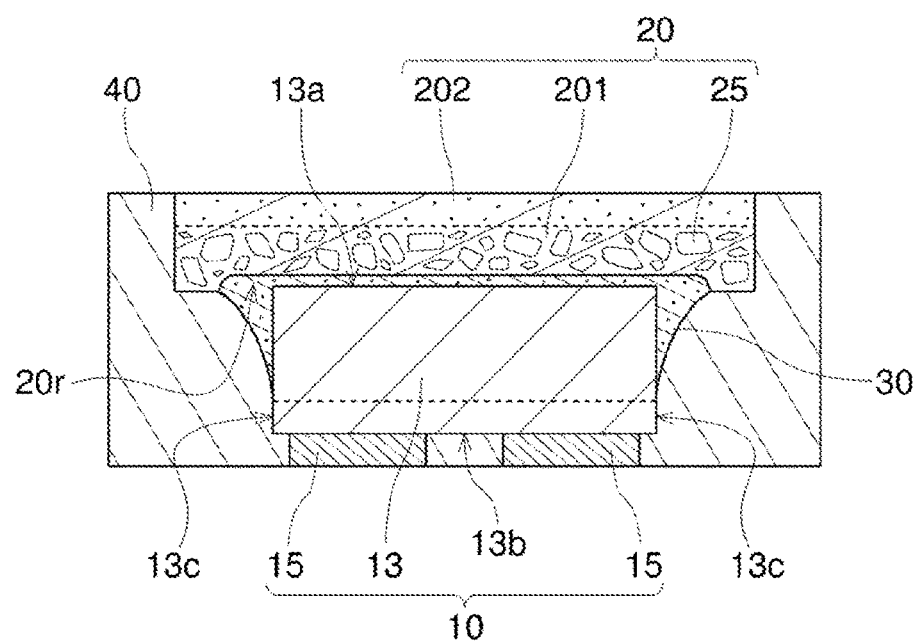
FIG. 1B is a schematic cross section view of cross section A-A of the light emitting device shown in FIG. 1A.

FIG. 1A is a schematic top view of a light emitting device 100 of embodiment 1. FIG. 1B is a schematic cross section view of cross section A-A of the light emitting device 100 shown in FIG. 1A.

As shown in FIGS. 1A and 1B, a light emitting device 100 of embodiment 1 is provided with an LED die 10, a wavelength conversion member 20, a light-transmissive member 30, and a light reflecting member 40. The LED die 10 is provided with a laminated structure 13 and an electrode 15. The laminated structure, 13 has a light emitting surface 13a, an electrode forming surface 13b on the reverse side of the light emitting surface 13a, and a side surface 13c between the light emitting surface 13a and the electrode forming surface 13b. The electrode 15 is placed on the electrode forming surface 13b. The wavelength conversion member 20 is placed above the LED die 10 (light emitting surface 13a side). A recess 20r is provided on the lower surface of the wavelength conversion member 20. The wavelength conversion member 20 contains a fluorescent substance 25. The light-transmissive member 30 connects the LED die 10 and the recess 20r of the wavelength conversion member. The light reflecting member 40 covers the electrode forming surface 13b of the LED die, the side surface of the wavelength conversion member 20, and the outer surface of the light-transmissive member 30. The lower surface of the electrode 15 is exposed from the light reflecting member 40.

Method for Manufacturing Light Emitting Device 100

FIGS. 2A, 2B, 2C, 2D, 2E, and 2F are each schematic cross section views for explaining a first step, second step, third step, fourth step, fifth step, and sixth step in the method for manufacturing the light emitting device 100 of embodiment 1.

The method for manufacturing the light emitting device 100 of embodiment 1 is provided at least with first to fifth steps such as those noted hereafter. Here, an example is shown in which a light emitting device array 150 is produced using the first to fifth steps, and a sixth step is provided for dividing that light emitting device array 150. If a plurality of light emitting devices are produced densely in this way, there is good work efficiency for each step, and manufacturing of the light emitting device 100 is possible with even better productivity.

First Step

Figure 2A:
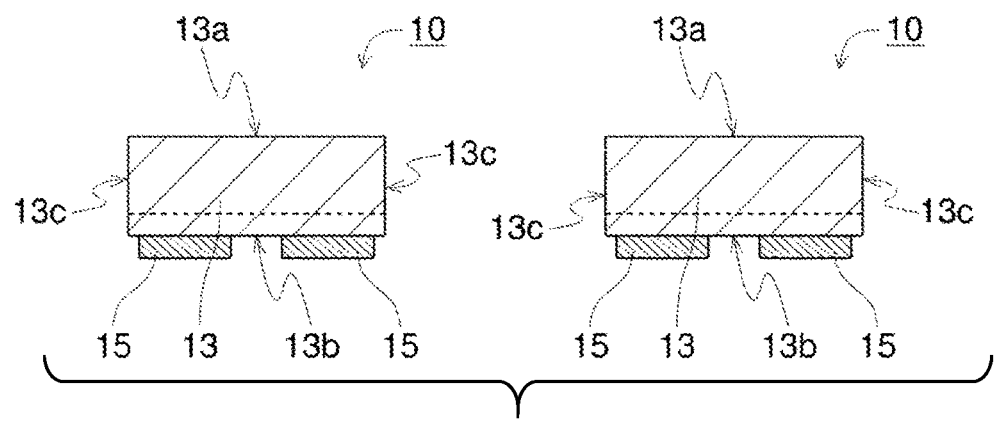
FIG. 2A is a schematic cross section view for explaining a step in the method for manufacturing a light emitting device of an embodiment of the present invention.

As shown in FIG. 2A, the first step is a step for preparing the LED die 10 that is provided with: the laminated structure 13 provided with the light emitting surface 13a, the electrode forming surface 13b on the reverse side of the light emitting surface 13a, and the side surface 13c between the light emitting surface 13a and the electrode forming surface 13b; and the electrode 15 placed on the electrode forming surface 13b. With this embodiment, a plurality of LED dice 10 are prepared. Details of the LED die 10 are explained later.

Second Step

Figure 2B:
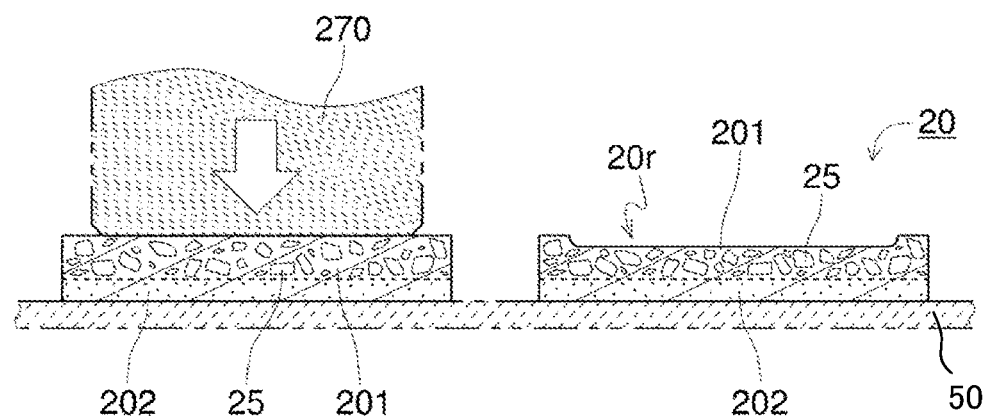
FIG. 2B is a schematic cross section view for explaining a step in the method for manufacturing a light emitting device of an embodiment of the present invention.

As shown in FIG. 2B, the second step is a step for preparing the wavelength conversion member 20 for which the recess 20r with the opening diameter larger than the light emitting surface 13a is provided on the upper surface. More specifically, the wavelength conversion member 20, for example, is obtained by producing a fluorescent sheet containing the fluorescent substance 25, and dividing that fluorescent sheet. With this embodiment, an item for which the fluorescent sheet is divided (divided into pieces) is used as the wavelength conversion member 20 and each piece is placed on a base member 50 as shown in FIG. 2B. However, it is also possible to use the fluorescent sheet as is as the wavelength conversion member 20 and do dividing at the sixth step. Also, with this embodiment, prepared is the wavelength conversion member 20 with a two-layer structure, having a fluorescent layer 201 containing the fluorescent substance 25, and a light-transmissive layer 202 that is substantially free of a fluorescent substance. The two-layer structure fluorescent sheet is preferably produced by joining two element sheets. As a result, it is easy to control to a suitable form the distribution of the fluorescent substance 25 within the fluorescent sheet and thus within the wavelength conversion member 20, making it easy to prepare the wavelength conversion member 20 with good productivity. Also, when joining two element sheets, the main ingredient of at least one of the two element sheets (preferably both) being in a state that is not completely cured or solidified is preferable from the perspective of element sheet joining strength and/or suppression of distortion within the fluorescent sheet. Also, a boundary, specifically an interface, of the two joined element sheets in the fluorescent sheet may be observed, but it is preferable not to be observed in the same view point. As used herein, "not completely cured or solidified" is a state for which curing or solidifying have progressed midway, and is called, for example, semi-cured, B-stage, gel state, semi-solidification, etc.

Using a method such as that noted hereafter, it is possible to stably form the recess 20r of the wavelength conversion member. For example, it is preferable to form the recess 20r of the wavelength conversion member by pressing a portion of the upper surface of the flat plate shaped wavelength conversion member using a pressing member 270. In this way, the recess 20r can be formed by having a portion of the plate surface of the flat plate shaped wavelength conversion member undergo plastic deformation. It is particularly preferable that the pressing member 270 be a collet. A collet has a function of vacuum suctioning and conveying a chip component, etc. If the pressing member 270 is a collet, in the arrangement process of the wavelength conversion member, it is possible to conveniently form the recess 20r. In addition, for example, it is preferable to form the recess 20r by forming the wavelength conversion member 20 provided with the recess 20r using a mold. In this way, the recess 20r can also be formed using a curing or solidifying process of the main ingredient of the wavelength conversion member 20.

Also, the top view shape of the recess 20r is preferably polygonal or circular. As a result, crawl-up to the side surface 13c of the laminated structure of the light-transmissive member 30 (hereafter may be noted as "fillet") can be formed easily in a suitable shape. In particular, when the top view shape of this recess 20r is polygonal, it is preferable that the shape be triangular, quadrilateral, or hexagonal, and it is more preferable that it be an equilateral triangle, a square, a rectangle that is long in one direction, or a regular hexagon. What is called "polygonal" here includes items for which the corners are rounded. Also, the top view shape of the recess 20r is preferably a shape that is mathematically similar to the top view shape of the LED die 10 (said another way, the shape of the light emitting surface 13a). The depth of the recess 20r can be selected as appropriate, but from the perspective of suppressing wet spreading to the upper surface (peripheral edge part excluding the recess 20r) of the wavelength conversion member 20 of the light-transmissive member 30, as well as luminous flux and light distribution of the light emitting device 100, etc., it is preferable that this be 5 to 70% of the thickness of the wavelength conversion member 20, and more preferably 10 to 40% of the thickness of the wavelength conversion member 20.

Also, the wavelength conversion member 20 preferably contains one or more of a resin or a filler. The shape of the recess 20r can be controlled by adjusting the viscosity of the wavelength conversion member 20 using the composition of the resin, the particle diameter or content of the filler, etc.

Also, it is preferable that the wavelength conversion member 20 have the fluorescent layer 201 containing the fluorescent substance 25, and the light-transmissive layer 202 that is substantially free of a fluorescent substance, and that the recess 20r be provided on the fluorescent layer 201. As a result, it is possible to adjust the light emission chromaticity distribution using mixed light within the light-transmissive layer 202, and also possible to suppress degradation of the fluorescent substance 25 due to outside air, etc. It is particularly preferable that the light-transmissive layer 202 contain a filler that functions as a light diffusing material from the perspective of mixed light within the light-transmissive layer 202.

Third Step

Figure 2C:
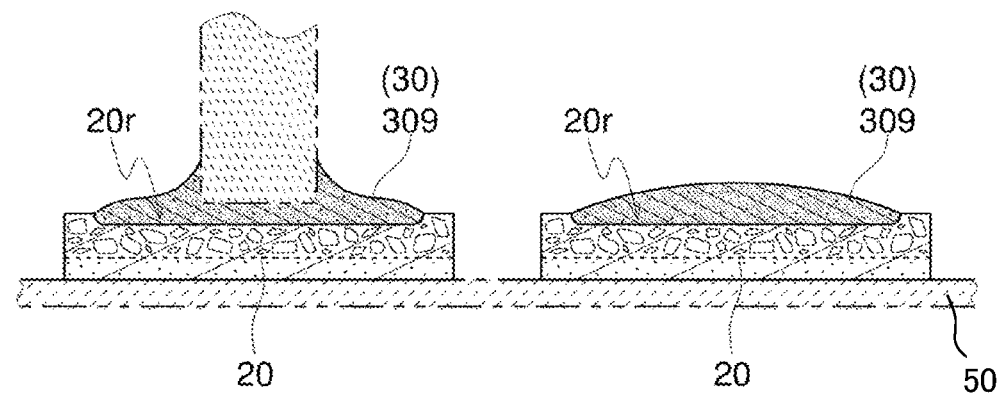
FIG. 2C is a schematic cross section view for explaining a step in the method for manufacturing at light emitting device of an embodiment of the present invention.

As shown in FIG. 2C, the third step is a step for placing the light-transmissive member 30 within the recess 20r. More specifically, the light-transmissive member 30 can be formed by curing or solidifying after coating a light-transmissive member liquid material 309 within the recess 20r of the wavelength conversion member. For the method for coating the light-transmissive member liquid material 309, it is possible to use a dispensing method, a transfer method, etc.

In the third step, it is preferable that the light-transmissive member 30 be placed within the recess 20r with its upper surface positioned to be the same height as the upper surface of the wavelength conversion member 20 or above the upper surface of the wavelength conversion member 20. As a result, a fillet of a suitable shape and/or amount is obtained on the side surface 13c of the laminated structure of the light-transmissive member 30. More specifically, using the upper surface of the wavelength conversion member 20 (peripheral edge part excluding the recess 20r) as a reference, the height of the upper surface of the light-transmissive member 30 is preferably 0.5 times to 3 times the depth of the recess 20r, and more preferably 1 time to 2 times the depth of the recess 20r.

Also, the light-transmissive member 30 preferably contains one or more of a resin a fluorescent substance, and a filler. The shape of the fillet of the light-transmissive member 30 can be controlled by adjusting the viscosity of the light-transmissive member liquid material 309 using the composition of the resin, as well as the particle diameter, content, etc. of the fluorescent substance and the filler.

Fourth Step

Figure 2D:
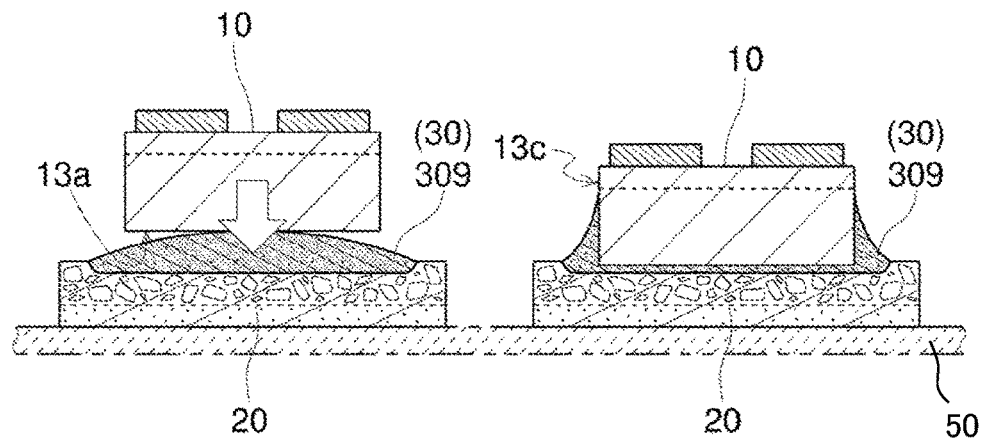
FIG. 2D is a schematic cross section view for explaining a step in the method for manufacturing a light emitting device of an embodiment of the present invention.

As shown in FIG. 2D, the fourth step is a step in which by mounting the LED die 10 facing opposite the light emitting surface 13a on the upper surface of the light-transmissive member 30, and pressing the LED die 10, at least a portion of the light-transmissive member 30 is placed on the side surface 13c of the laminated structure. More specifically, the LED die 10 facing opposite the light emitting surface 13a is mounted on the upper surface of the light-transmissive member liquid material 309. Then, the LED die 10 is pressed, and at least a portion of the light-transmissive member liquid material 309 is made to crawl up the side surface 13c of the laminated structure. After that, the light-transmissive member liquid material 309 is cured or solidified.

Fifth Step

Figure 2E:
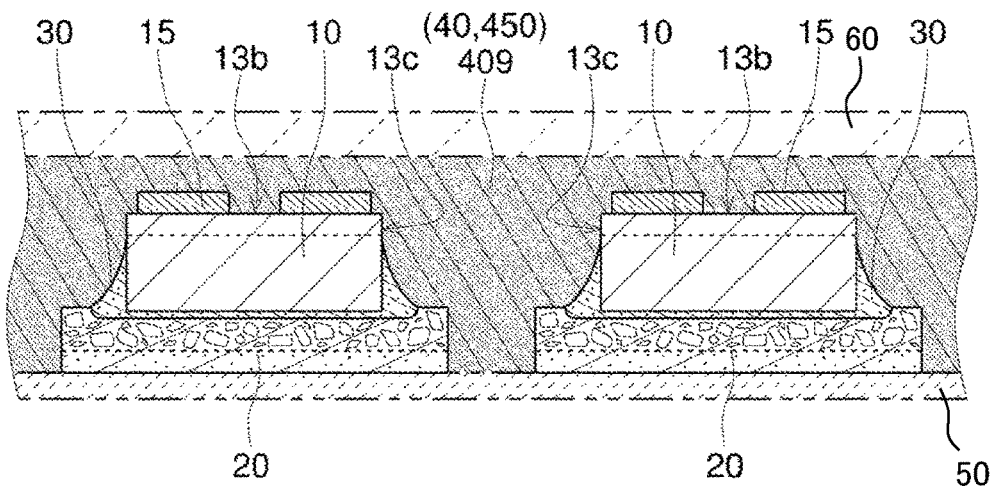
FIG. 2E is, a schematic cross section view for explaining a step in the method for manufacturing a light emitting device of an embodiment of the present invention.

As shown in FIG. 2E, the fifth step is a step for placing the light reflecting member 40 that covers the LED die 10, the light-transmissive member 30, and the wavelength conversion member 20. More specifically, a light reflecting member liquid material 409 is continuously coated on the LED die 10, the light-transmissive member 30, and the wavelength conversion member 20 by, for example, using a mold 60, and then the light reflecting member is cured or solidified. With this embodiment 1, by doing continuous covering of a plurality of LED dice 10, formation is done as an integrally molded article 450 of the light reflecting member 40. The light reflecting member 40 can be formed using compression molding, transfer molding, injection molding, potting, etc.

From the perspective of light extraction efficiency in the main light emitting direction, it is preferable that the, light reflecting member 40 cover the electrode forming surface 13b (the part excluding the electrode 15) of the laminated structure. Also, it is preferable that the light reflecting member 40 cover at least a portion of the side surface of tile electrode 15, more preferable that it cover half or more of the side surface of the electrode 15, and even more preferable that it cover all of the side surface of the electrode. In particular, with this embodiment, it is possible to form the light-transmissive member 30 so as to cover from above the side surface 13c of the laminated structure to above the electrode forming surface 13b. For that reason, by setting the placement range of the, light reflecting member 40 in this way, it is possible to suppress leaking of light of the LED die 10 from the electrode forming surface 13b side. To realize this kind of light reflecting member 40 placement, it is preferable to place the light reflecting member 40 by, after forming to cover the entire electrode 15, doing removal to the degree of exposing at least a portion of the electrode 15. For the method for removing the excess portion of the light reflecting member 40, it is possible to use grinding or blasting, etc. On the other hand, it is also possible to form the light reflecting member 40 in a state with the upper surface of the electrode 15 masked using a mold, etc.

Sixth Step

Figure 2F:
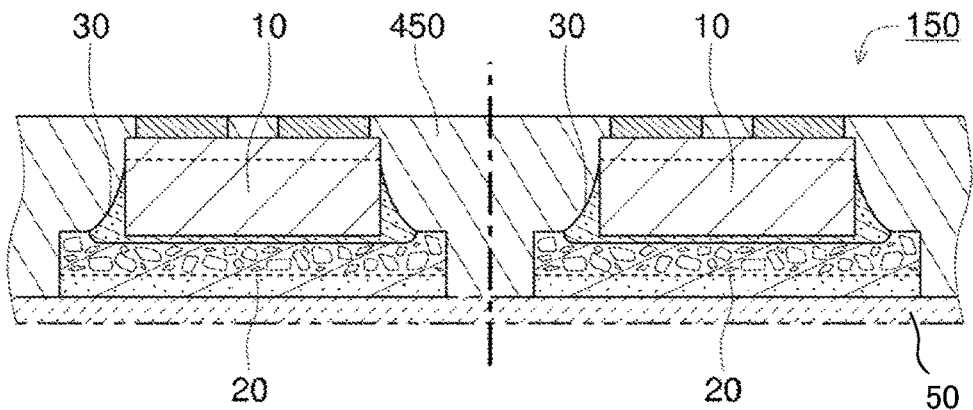
FIG. 2F is a schematic cross section view for explaining a step in the method for manufacturing a light emitting device of an embodiment of the present invention.

As shown in FIG. 2F, the sixth step is a step for dividing the light emitting device array 150. More specifically, the light reflecting member integrally molded article 450 is cut in linear form or grid form at designated positions of the light emitting device array 150, specifically, between the wavelength conversion members 20, to divide the light emitting device 100 into pieces. Then the light emitting device 100 is separated from the base, member 50. For cutting the light emitting device array 150, for example, it is possible to use a dicer, an ultrasonic cutter, a Thomson blade, etc. When manufacturing one light emitting device 100 at a time individually, it is possible to omit the sixth step.

According to the method for manufacturing the light emitting device 100 having the kind of configuration noted above, by placing the light-transmissive member 30 within the recess 20r of the wavelength conversion member, it is possible to inhibit wet spreading of the light-transmissive member 30 on the upper surface of the wavelength conversion member 20, and thus wet spreading to the side surface. Also, by changing the shape and/or depth of the recess 20r, it is possible to control the shape and/or the size of the fillet of the light-transmissive member 30 formed on the side surface 13c of the LED die. Therefore, it is easier to control the shape of the light-transmissive member 30 that connects the LED die 10 and the wavelength conversion member 20, and possible to inhibit variation of the luminous flux and/or light distribution. Also, it is possible to suppress leaking of the light from the LED die 10 to outside the device through the light-transmissive member 30 that underwent wet spreading beyond the intended range.

Following, each constituent element of the light emitting device of an embodiment of the present invention is explained.

LED Die 10

The LED die has a laminated structure including a light emitting element structure, and an electrode for supplying electricity to the laminated structure. The top view shape of the LED die is preferably triangular, quadrilateral, or hexagonal, and arming these, a square or a rectangle that is long in one direction is more preferable. The LED die or its laminated structure side surface may be perpendicular with respect to the upper surface or the lower surface (light emitting surface or electrode forming surface), or may be inclined to the inside or to the outside. The number of LED dice mounted on one light emitting device may be one or a plurality. The plurality of LED dice can be connected in series or in parallel.

Laminated Structure 13

The laminated structure includes at least a semiconductor laminate, and may further include a substrate.

Semiconductor Laminate

The semiconductor laminate includes at least an n type semiconductor layer and a p type semiconductor layer, and an active layer is preferably interposed between these. As a semiconductor material, it is preferable to use a nitride semiconductor that has easy excitation of the fluorescent substance and is capable of efficiently emitting short wavelength light. The nitride semiconductor is mainly expressed by general formula $In_xAl_yGa_{1-x-y}N$ ($0 \leq x$, $0 \leq y$, $x+y \leq 1$). In addition, it is also possible to use zinc sulfide, zinc selenide, silicon carbide, etc. From the perspective of light emission efficiency, as well as the fluorescent substance excitation and mixed color relationship with the light emission, etc., the light emission peak wavelength at the LED die is preferably in the blue color range, and more preferably in a range of 450 nm to 475 nm. The thickness of the semiconductor laminate can be selected as appropriate, but from the perspective of light emission efficiency, crystallinity, etc., it is preferably 1 µm to 10 µm, and more preferably 3 µm to 10 µm.

Substrate

For the substrate, a substrate for crystal growth capable of growing semiconductor crystals is preferable since it is simple, but it is also possible to use a substrate for joining that is separately joined to a laminated structure separated from the substrate for crystal growth. By the substrate being translucent, it is easy to use the flip-chip type, and easy to increase the light extraction efficiency. As the substrate, it is possible to use one item from among sapphire, gallium nitride, aluminum nitride, silicon, silicon carbide, gallium arsenide, gallium phosphorus, indium phosphorus, zinc sulfide, zinc selenide, or glass. Among these, sapphire is preferable in terms of having excellent translucency, and being relatively inexpensive and easy to obtain as a substrate for cry stall gown of a nitride semiconductor. Also, gallium nitride is suitable as a substrate for crystal growth of a nitride semiconductor, and is preferable from the point of having relatively high thermal conductivity. The thickness of the substrate can be selected as appropriate, but from the perspective of light extraction efficiency, mechanical strength, etc., it is preferably 50 µm to 500 µm, and more preferably 80 µm to 300 µm.

Electrode 15

In addition to positive and negative electrodes formed in contact with the semiconductor layer, it is also possible to include bumps, pillars, lead electrodes (lead frames divided into pieces), etc. connected to the positive and negative electrodes and provided separately. The electrode can be configured as a film and/or small pieces of a metal or an alloy. More specifically, it is possible to use at least one item among gold, silver, copper, iron, tin, platinum, zinc rhodium, titanium, nickel, palladium, aluminum, tungsten, chrome, molybdenum, and alloys of these. Among these, it is especially preferable that the electrode include copper or a copper alloy, which have excellent thermal conductivity and are relatively inexpensive. Also, from the perspective of solder bondability, it is preferable that the electrode have a gold or silver coating on the surface. The electrode can be formed using plating, sputtering, vapor deposition, printing, etc.

Wavelength Conversion Member 20

The wavelength conversion member has a function of transmitting light of the LED die and the fluorescent substance to the device exterior while protecting the light-transmissive member and the light reflecting member as well as the LED die, from outside air, external force, etc. The wavelength conversion member has at least a light-transmissive main ingredient, and further contains a fluorescent substance in that main ingredient. The top view shape of the wavelength conversion member being a shape that is larger than the LED die, and mathematically similar to the top view shape of the LED die is preferable in terms of light intensity distribution, chromaticity distribution, etc. The upper surface and/or the lower surface of the wavelength conversion member has good productivity if it is a flat surface, and the light extraction efficiency can be increased if it is a surface having recesses and projections or is a curved surface. The wavelength conversion member can be configured with a single layer in the thickness direction, or can be configured as a laminate of a plurality of layers. When the wavelength conversion member is configured as a laminate, it is possible to use different types of main ingredient for each layer, or to contain different types of fluorescent substance for each layer. Also, by having the outermost layer be a layer that is substantially free of a fluorescent substance, it is possible to suppress degradation of the fluorescent substance due to outside air, etc. The thickness of the wavelength conversion member can be selected as appropriate, but from the perspective of the light extraction efficiency, fluorescent substance content, etc., it is preferably 50 µm to 500 µm, and more preferably 80 µm to 300 µm.

Main Ingredient of the Wavelength Conversion Member

For the main ingredient of the wavelength conversion member, it is possible to use at least one of silicone resin, epoxy resin, phenol resin, polycarbonate resin, acrylic resin, and modified resins of these, as well as glass. Among these, silicone resin or its modified resin are preferable in terms of having excellent heat resistance and light resistance. Specific examples of Me silicone resin include dimethyl silicone resin, phenylmethyl silicone resin, and diphenyl silicone resin. In particular, by including a phenyl group, the thermal resistance and gas barrier properties are strengthened. The "modified resins" in this specification include hybrid resins.

Fluorescent Substance 25

The fluorescent substance absorbs at least a portion of light emitted from the LED die (primary light), and emits light of a different wavelength from the primary light (secondary light). As a result, it is possible to have a light emitting device that emits visible wavelength primary light and secondary light mixed color light such as white light, for example. In the case of a white light emitting light emitting device, the emitted light color range preferably conforms to the ANSI C78.377 standard. The content of the fluorescent substance in the wavelength conversion member can be selected as appropriate according to the desired emitted light chromaticity, but, for example, is preferably 40 parts by weight to 250 parts by weight, and more preferably 70 parts by weight to 150 parts weight. "Parts by weight" represents weight (g) of the concerned particle mixed in relation to 100 g by weight of the main ingredients. The light emission peak wavelength of the green light emitting fluorescent substance is preferably in the range of 520 nm to 560 nm from the perspective of light emitting efficiency, and the mixed color relationship with light of other light sources, etc. More specifically, as the green light emitting fluorescent substance, examples include yttrium-aluminum-garnet based phosphor (e.g. $Y_3(Al, Ga)_5O_{12}$:Ce), lutetium-aluminum-garnet based phosphor (e.g. $Lu_3(Al, Ga)_5O_{12}$:Ce), terbium-aluminum-garnet based phosphor (e.g. $Tb_3(Al, Ga)_5O_{12}$:Ce), silicate based phosphor (e.g. $(Ba, Sr)_2SiO_4$:Eu), chlorosilicate based phosphor (e.g. $Ca_8Mg(SiO_4)_4C_{12}$:Eu), β sialon based phosphor (e.g. $Si_{6-z}Al_zO_zN_{8-z}$:Eu (0<z<4.2)), SGS based phosphor (e.g. $SrGa_2S_4$:Eu). As the yellow light emitting fluorescent substance, examples include a sialon based phosphor (e.g. $Mz(Si, Al)_{12}(O,N)_{16}$ (where 0<z≤2, and M is a lanthanide element excluding Li, Mg, Ca, Y, and La and Ce)). In addition, there are also yellow light emitting fluorescent substances among the aforementioned green light emitting fluorescent substances. Also, for example, with the yttrium-aluminum-garnet based phosphors, by substituting a portion of Y with Gd, it is possible to shift the light emission peak wavelength to the longer wavelength side, and possible to emit yellow light. Also, among these, there are also fluorescent substances that can emit orange light. The light emission peak wavelength of the fluorescent substances that emit red light is preferably in the range of 620 nm to 670 nm from the perspective of light emitting efficiency and the mixed color relationship with light of other light sources, etc. More specifically, as the red light emitting fluorescent substance, examples include nitrogen-containing calcium aluminosilicate (CASN or SCASN) based phosphor (e.g. (Sr, Ca)AlSiN₃:Eu), etc. In addition, examples include phosphors represented by manganese activated fluoride based phosphors (phosphors represented by the general formula (I) $A_2[M_{1-a}Mn_aF_6]$ (where in the aforementioned general formula (I), A is at least one type selected from a group comprising K, Li, Na, Rb, Cs, and $NH_4$, M is one type of element selected from a group comprising group 4 elements and group 14 elements, and a satisfies 0<a<0.2)). As a representative example of this manganese activated fluoride based phosphor, there is a manganese activated potassium fluorosilicate phosphor (e.g. $K_2SiF_6$:Mn). For the fluorescent substance, it is possible to use only one type among the specific examples noted above, or to combine two or more types. For example, it is possible to configure the fluorescent substance using phosphors that emit green to yellow light, and phosphors that emit red light. Using this kind of configuration, it is possible to have light emission that is excellent in terms of color reproduction or color rendering properties.

Filler

For the filler, an organic substance is acceptable, but an inorganic substance, which has excellent thermal resistance and light resistance, is preferable. Also, with an inorganic substance, it is easy to have it also function as a filler for adjusting the thermal conductivity, the thermal expansion coefficient, etc., of the wavelength conversion member. More specifically, as the inorganic substance, it is preferable to use at least one among silicon oxide, titanium oxide, magnesium oxide, zinc oxide, aluminum oxide, zirconium oxide, calcium carbonate, and barium sulfate. Among these, silicon oxide, titanium oxide, and zirconium oxide are preferable in terms of being relatively inexpensive and easy to obtain. Also, magnesium oxide, zinc oxide, and aluminum oxide are preferable in terms of thermal conductivity. An organic substance has the advantage of being able to adjust optical characteristics using copolymerization, etc. More specifically, as the organic substance, polymethacrylic acid esters and copolymers thereof, polyacrylic acid esters and copolymers thereof, cross-linked polymethacrylic acid esters, cross-linked polyacrylic acid esters, polystyrene and copolymers thereof, cross-linked polystyrene, silicone resin, and modified resins of these are preferable. For the filler, it is possible to use one type of these alone, or two or more types of these in combination. The content of the filler in the wavelength conversion member can be selected as appropriate, but is preferably 1 part by weight to 100 parts by weight, and more preferably 5 parts by weight to 50 parts by weight. The filler shape can be selected as appropriate, and can be a granular shape (amorphous), but a spherical shape is preferable in terms of filling properties, agglomeration suppression, etc.

Light-Transmissive Member 30

The light-transmissive member is translucent, and does light guiding of the light of the LED die to the wavelength conversion member, and in addition, is able to adhere the LED die and the wavelength conversion member. From the perspective of light extraction efficiency, the outer surface of the light-transmissive member, specifically, the interface with the light reflection member, is preferably inclined or curved with respect to the side surface of the laminated structure and the lower surface of the wavelength conversion member. For the main ingredient of the light-transmissive member, it is possible to use at least one of silicone resin, epoxy resin, phenol resin, polycarbonate resin, acrylic resin, modified resins of these, as well as glass. Among these, silicone resin or its modified resin is preferable in terms of excellent heat resistance and light resistance. Specific examples of the silicone resin include dimethyl silicone resin, phenylmethyl silicone resin, diphenyl silicone resin, etc. In particular, by including a phenyl group, the heat resistance and gas barrier properties are strengthened. The light transmissive member may also contain various types of filler in the main ingredients. As that filler, it is possible to use the same item as the filler of the wavelength conversion member noted above.

Light Reflecting Member 40

The light reflecting member is preferably white from the perspective of light extraction efficiency. Thus, the light reflecting member preferably contains a white pigment in the main ingredient. For the main ingredient of the light reflecting member, it is possible to use at least one item from among silicone resin, epoxy resin, phenol resin, polycarbonate resin, acrylic resin, modified resins of these, as well as glass. Among these, silicone resin or a modified resin thereof is preferable in terms of having excellent heat resistance and light resistance. Specific examples of silicone resin include dimethyl silicone resin, phenylmethyl silicone resin, and diphenyl silicone resin. In particular, by including a phenyl group, the heat resistance and gas barrier properties are strengthened. For the white pigment, it is possible to use titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, and zirconium oxide as one type alone or as two or more types in combination. Among these, titanium oxide is preferable in terms of having excellent light reflectivity, being relatively inexpensive and easy to obtain. The content of the white pigment in the light reflecting member can be selected as appropriate, but from the perspective of light reflectivity and viscosity when a liquid material, etc., it is preferably 20 parts by weight to 300 parts by weight, and more preferably 50 parts by weight to 200 parts by weight.

Above, an example of an upper surface light emitting (top view) type was used for the light emitting device of embodiment 1, but depending on the placement relationship of the terminals with respect to the main light emitting direction, it is also possible to use a side surface light emitting (side view) type. The mounting direction of the upper surface light emitting type light emitting device is the reverse direction approximately parallel to the main light emitting direction. For example, the mounting direction of the light emitting device of embodiment 1 is the downward direction. On the other hand, the mounting direction of the side surface light emitting type light emitting device is approximately perpendicular to the main light emitting direction.

WORKING EXAMPLE

Following, is a detailed description of a working example of the present invention. It goes without saying that the present invention is not limited to only the working example shown below.

Working Example 1

The light emitting device of working example 1 is an upper surface light emitting and surface mount type LED device of a rectangular parallelepiped of 1.7 mm width, 1.7 mm depth, and 0.39 mm thickness, having the structure of the light emitting device 100 of the example shown in FIGS. 1A and 1B. The LED die 10 is a top view square shaped die of 1.0 mm width, 1.0 mm depth, and 0.17 mm thickness capable of emitting blue light at light emission peak wavelength 455 nm. The LED die 10 has the laminated structure 13 for which a nitride semiconductor n type semiconductor layer, active layer, and p type semiconductor layer are laminated in sequence on a sapphire substrate. A pair of the electrodes 15 is connected to the electrode forming surface 13b of the laminated structure. The pair of electrodes 15 are each configured as a multilayer film of titanium/nickel/gold/copper, and a small piece of copper of thickness 0.04 mm with a film of nickel/gold adhered. The wavelength conversion member 20 is connected to the light emitting surface 13a side of the laminated structure with the light-transmissive member 30 interposed. The wavelength conversion member 20 is a small piece of phosphor-containing resin in a top view square shape of 1.2 mm width, 1.2 mm depth, and 0.22 mm thickness. The center and orientation of the LED die 10 and the wavelength conversion member 20 in the top view are matching (note that this includes manufacturing errors). The wavelength conversion member 20 is configured by two layers such as the fluorescent layer 201 (lower layer) and the light-transmissive layer 202 (upper layer) shown below. However, a boundary of the fluorescent layer 201 and the light-transmissive layer 202 is not observed. The fluorescent layer 201 is a cured substance of a phenylmethyl silicone resin containing an LAG type phosphor and an SCASN type phosphor as the fluorescent substance 25. The fluorescent layer 201 has the recess 20r in approximately the center of the lower surface side. The light-transmissive layer 202 is a cured substance of a phenylmethyl silicone resin containing spherical particles of silicon oxide of average particle diameter 5 to 50 nm as the filler. The light-transmissive member 30 covers the light emitting surface 13a and the four side surfaces 13c of the laminated structure, and the inner surface of the recess 20r of the wavelength conversion member 20. The edge of the light-transmissive member 30 is near the edge of the recess 20r. The outer surface of the light-transmissive member 30 is inclined and curved with respect to the side surface 13c of the laminated structure and the lower surface of the wavelength conversion member 20 (peripheral edge part excluding the recess 20r: flat part). The light-transmissive member 30 is a cured substance of a phenylmethyl silicone resin containing spherical particles of silicon oxide of average particle diameter 5 to 50 nm as the filler. The light reflecting member 40 covers the outer surface of the light-transmissive member 30 in the side direction of the laminated structure 13, and covers the area excluding the pair of electrodes 15 of the electrode forming surface 13b of the laminated structure below the laminated structure 13. If the light-transmissive member 30 is not covering a part (lower part) of the side surface 13c of the laminated structure, the light reflecting member 40 covers the part (lower part) of the side surface 13c of the laminated structure. Also, the light reflecting member 40 covers the side surface of the wavelength conversion member 20. The light reflecting member 40 is a cured substance of a phenylmethyl silicone resin containing 150 parts by weight of titanium oxide. The lower surface of the pair of electrodes 15, specifically, the gold film surface, is exposed from the light reflecting member 40. In more specific detail, the lower surface of this light emitting device is configured by the lower surface of the light reflecting member 40 and the lower surface of the pair of electrodes 15.

For the light emitting device of working example 1, as shown hereafter, manufacturing is done by producing the light emitting device array 150, and dividing the light emitting device array 150 using a dicing device. First, the fluorescent sheet is produced by pressure bonding and completely curing a 70 μm thick first element sheet that will be the fluorescent layer 201 and a 150 μm thick second element sheet that will be the light-transmissive layer 202. Then, the fluorescent sheet is cut in grid form with a dicer to the aforementioned size, and a plurality of wavelength conversion members 20 are obtained. Next, the wavelength conversion members 20 are vacuum suctioned using a collet that is also the pressing member 270, the fluorescent layer 201 side is faced upward, and these are arranged vertically and horizontally in designated intervals on a polyimide tape. At this time, the upper surface of each fluorescent layer 201 is pressed by the collet, and the recess 20r is formed. The shape of the collet suction surface is square. The depth of the recess 20r is 25 μm. Next, the light-transmissive member liquid material 309 is coated within the recess 20r of each wavelength conversion member by pin transfer. At this time, the, upper surface of the light-transmissive member liquid material 309 is positioned above the upper surface of the wavelength conversion member 20. Next the sapphire substrate side of the LED die 10 for which each of the small pieces of copper are connected to the positive and negative electrodes is mounted on each light-transmissive member liquid material 309 coated on the wavelength conversion member 20. Furthermore, the push-in amount of the LED die 10 is adjusted, and the light-transmissive member liquid material 309 is made to crawl up the four side surfaces of the LED die 10. Then, the light-transmissive member liquid material 309 is cured in an oven. Next, the light reflecting member liquid material 409 is filled and cured using a compression molding method so as to completely embed all the copper small pieces of the LED die 10. Then, the obtained light reflecting member integrally molded article 450 undergoes grinding to expose the copper small pieces. Thereafter, a nickel/gold film is film formed using a sputtering device on the exposed surface of each of the copper small pieces, and this is used as the electrode 15. Finally, the light emitting device array 150 obtained as described above is cut into grid form using a dicer.

The method for manufacturing a light emitting device of working example 1 configured as described above can exhibit the same effects as the method for manufacturing the light emitting device 100 of embodiment 1.

The light emitting device of an embodiment of the present invention can be used for a backlight device of a liquid crystal display, various types of lighting equipment, large displays, various types of display devices for advertising, destination guides, etc., projector devices, and also for image reading devices such as for digital video cameras, fax machines, copy machines, scanners, etc.

What is claimed is:

1. A method for manufacturing a light emitting device comprising:
    preparing an LED die having
        a laminated structure including a light emitting surface, an electrode forming surface on a reverse side of the light emitting surface, and a side surface between the light emitting surface and the electrode forming surface, and
        at least one electrode placed on the electrode forming surface;
    preparing a wavelength conversion member having an upper surface defining a recess, the recess having an opening diameter greater than a diameter of the light emitting surface in a plan view;
    placing a light-transmissive member within the recess;
    mounting the LED die on an upper surface of the light-transmissive member while the light emitting surface faces the upper surface of the light-transmissive member, and pressing the LED die so that at least a portion of the light-transmissive member is placed on the side surface of the laminated structure; and
    placing a light reflecting member to cover the LED die, the light-transmissive member, and the wavelength conversion member.

2. The method for manufacturing a light emitting device according to claim 1, wherein
    the placing of the light-transmissive lumber within the recess includes placing the light-transmissive member within the recess so that the upper surface of the light-transmissive member is positioned at the same height as or higher than the upper surface of the wavelength conversion member adjacent to the recess.

3. The method for manufacturing a light emitting device according to claim 1, wherein
    a shape of the recess in the plan view is polygonal or circular.

4. The method for manufacturing a light emitting device according to claim 1, wherein
    the preparing of the wavelength conversion member includes providing the wavelength conversion member having a flat plate shape and firming the recess by pressing a portion of the upper surface of the wavelength conversion member using a pressing member.

5. The method for manufacturing a light emitting device according to claim 4, wherein
    the pressing member is a collet.

6. The method for manufacturing a light emitting device according to claim 1, wherein
    the preparing of the wavelength conversion member includes forming the wavelength conversion member with the recess using a mold.

7. The method for manufacturing a light emitting device according to claim 1, wherein
    the preparing of the wavelength conversion member includes preparing the wavelength conversion member having a fluorescent layer containing a fluorescent substance, and a light-transmissive layer that is substantially free of the fluorescent substance, with the recess being arranged in the fluorescent layer.

8. The method for manufacturing a light emitting device according to claim 1, further comprising
    removing a portion of the light reflecting member until at least a portion of the at least one electrode is exposed after the placing of the light reflecting member.

9. The method for manufacturing a light emitting device according to claim 1, wherein
    the wavelength conversion member contains at least one or a resin and a filler.

10. The method for manufacturing a light emitting device according to claim 1, wherein
    the light-transmissive member includes at least one of a resin, a fluorescent substance, and a filler.

* * * * *